United States Patent
Keller et al.

Patent Number: 5,686,877
Date of Patent: Nov. 11, 1997

[54] APPARATUS AND METHOD FOR THE RAPID DISCHARGE OF SUPERCONDUCTING MAGNET COIL

[75] Inventors: Tony Keller; Gunter Laukien, both of Rheinstetten, Germany; Rene Jeker, Hombrechtikon, Switzerland; Arne Kasten, Karlsruhe, Germany

[73] Assignee: Bruker-Analytische Messtechnik GmbH, Rheinstetten, Germany

[21] Appl. No.: 559,363

[22] Filed: Nov. 16, 1995

[30] Foreign Application Priority Data

Nov. 22, 1994 [DE] Germany ............ 44 41 575.3

[51] Int. Cl.$^6$ ............................. H01F 7/22
[52] U.S. Cl. ............................. 335/216; 361/19
[58] Field of Search ............ 361/19, 141; 335/216; 338/325

[56] References Cited

U.S. PATENT DOCUMENTS

| | | | |
|---|---|---|---|
| 3,521,207 | 7/1970 | Britton et al. | 335/216 |
| 3,956,727 | 5/1976 | Wolf | 338/32 S |
| 4,807,084 | 2/1989 | Takechi | 361/141 |
| 5,382,785 | 1/1995 | Rink | 250/205 |

FOREIGN PATENT DOCUMENTS 2158309  11/1985  United Kingdom.

*Primary Examiner*—Michael L. Gellner
*Assistant Examiner*—Raymond Barrera

[57] ABSTRACT

A device for the safe discharge of a superconducting magnet coil (4) which is located inside a cryostat (2) and superconductively short-circuited by a superconducting switch (7) providing at or in the cryostat (2) a transmitter (10) of electromagnetic energy being located at a temperature level considerably above the cryogenic temperature of the superconducting magnet coil (4), which transmitter can be switched on quickly from outside, and by arranging in the region of the superconducting switch (7) at the cryogenic temperature level of the superconducting magnet coil (4) a receiver (20) for the emitted electromagnetic energy, which transmits the received energy directly or indirectly to a heating device (15) of the superconducting switch (7) or which activates an auxiliary energy source (41) in the region of the superconducting switch (7), which on its turn effects a heating of the superconducting switch (7), so that it becomes normal-conducting and causes a discharge process of the superconducting magnet coil (4) via resistors (18) and/or diodes (19), being located at the cryogenic temperature level, there being no electrically conducting connection between transmitter (10; 10') and receiver (20). In this way, the magnet can be discharged without contact.

13 Claims, 4 Drawing Sheets

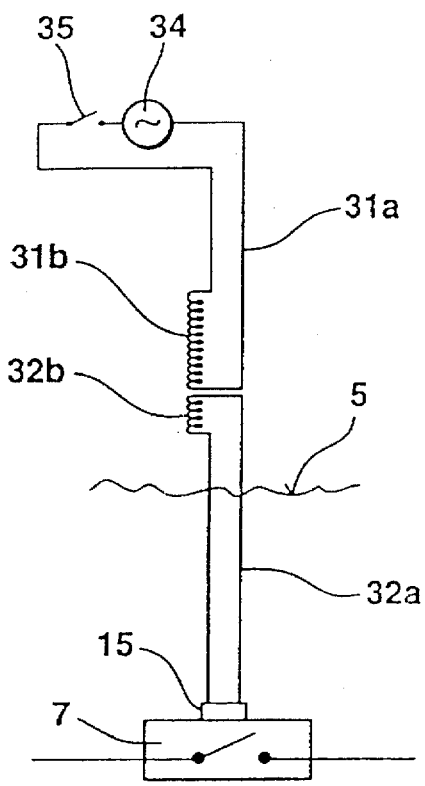
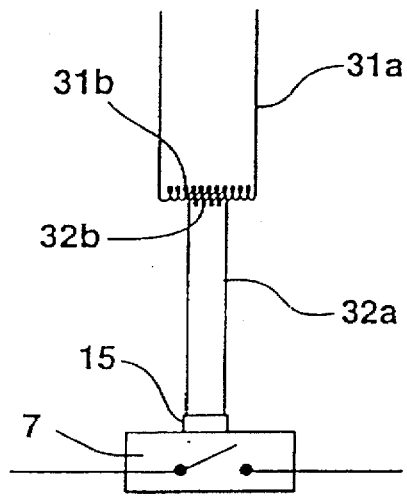
Fig. 5a	Fig. 5b
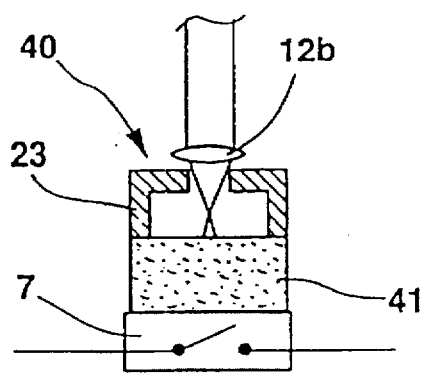
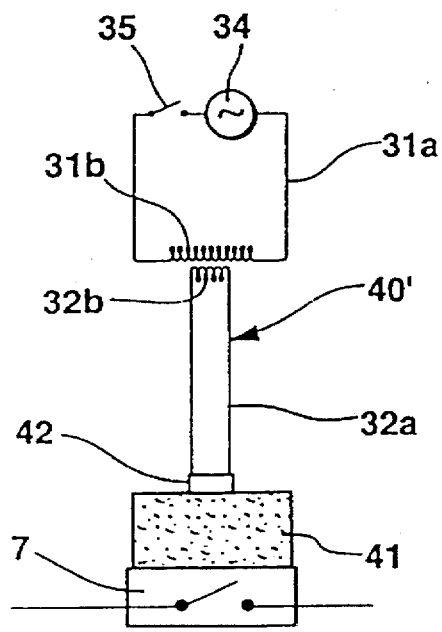
Fig. 6a	Fig. 6b

APPARATUS AND METHOD FOR THE RAPID DISCHARGE OF SUPERCONDUCTING MAGNET COIL

BACKGROUND OF THE INVENTION

The invention concerns a device for the rapid discharge of a superconducting magnet coil which is short-circuited by a superconducting switch, in particular of an NMR spectrometer.

Such devices are, for example, known from NMR spectrometer cryostats comprising a superconducting magnet coil, as supplied by Bruker Analytische Messtechnik GmbH, and from the accompanying manuals.

In prior art cryostats the magnet coil, which is located inside a helium tank under liquid helium, is charged and discharged by current leads inserted from outside. Electric leads to a superconducting persistent current switch at the magnet coil are guided inside the helium tank together with the current leads. The superconducting persistent current switch can be heated and thereby made resistive via these electric leads to which it is attached. In this way it is ensured that the charging current flows through the coil and not through the switch. When the desired current is reached, the switch heating is switched off, thereby the switch becomes superconducting and the current through the current leads can be reduced to zero, so that finally in the persistent mode the entire magnet current flows through the superconducting switch. Following final adjustments, for example to homogenize the magnetic field via leads to so-called superconducting shim coils attached to the main magnet coil, the current leads together with all further electric leads to the magnet coil inside the helium tank can be extracted. Apart from the suspension, which is optimized for extremely low heat input into the helium tank, there is then no further connection between the magnet coil and surroundings. This has the advantage of permitting extremely low refrigerant losses and small perturbations of the thermal equilibrium state, which has a positive effect on the stability and homogeneity of the magnetic field during persistent operation.

However, this has also the disadvantage that the deliberate switching off of the magnetic field is very difficult, without a large effort and trained personnel. In effect, it is possible only by re-inserting the current leads. This is a tedious procedure requiring trained personnel, a long time, and always giving rise to a risk of contaminating the helium tank by the ingress of moist air. The switch heater is heated by its leads integrated into the current leads, thereby the superconducting short-cut is opened and discharge of the magnet coil is effected, either slowly via an external power supply connected to the current leads or rapidly, i.e. within seconds, via protective resistors or diodes. This rapid discharge, caused deliberately, leads to a rather instant helium evaporation out of the tank, but with careful design of coil and cryostat this is not detrimental.

However, there are occasions where it would be desirable to switch off the magnetic field as immediately as possible also by a user untrained in cryotechnology. For example if service work is planned, the magnetic field could be switched off by the user days before the actual service personnel arrive. In this way, the cryostat would already be in a thermal equilibrium state when the service personnel arrive, so that the actual maintenance work could start immediately, saving time and costs. Similar considerations apply, if the magnetic field has to be switched off on short notice for other reasons, in particular during an accident, e.g. if a piece of ferromagnetic material which had been brought into the stray field region by negligence had been attracted by the magnet necessitating removal as quickly as possible. The prior art cryostats with persistent superconducting magnet coil without electric leads do not allow for switching off the field within seconds, or only by unconventional means which in turn represent a danger for the personnel, the cryostat and the magnet.

It would in principle be possible to provide a permanent electric lead to the heater of the superconducting switch, independent of the current lead. Such a permanent connection, however, would lead to an additional permanent heat input into the helium tank and thereby increase the helium consumption and reduces the time for which it is possible to operate without refill. In addition, such heat inputs can in principal influence the system stability, which should be avoided in particular with magnets used for high resolution NMR spectrometry.

The present invention seeks to provide a device of the kind mentioned above in which discharge can be effected rapidly in the absence of cryotechnically trained personnel, and without significant influence on stability and the interval between helium refills.

SUMMARY OF THE INVENTION

In accordance with the invention, there is provided a device for the safe discharge of a superconducting magnet coil within a cryostat for maintaining the coil at or below a cryogenic temperature, in particular a cryostat adapted to be filled with a cryogenic fluid, the magnet having a superconducting switch, for superconductively short-circuiting the magnet during operation, wherein the device comprises an energy dissipation device located so as, during operation, to be at or below the cryogenic temperature a transmitter of electromagnetic energy located so as, during operation, to be above the cryogenic temperature, switching means for switching on the transmitter from outside the cryostat, and a receiver for the said electromagnetic energy, the said receiver being positioned in the region of the superconducting switch at a location which, during operation, is at or below the cryogenic temperature, wherein the receiver is such that, upon reception of electromagnetic energy from the transmitter, the the receiver effects a heating of the superconducting switch to cause it to lose its superconductivity, and thereby cause a discharge process of the superconducting magnet coil via, the energy dissipation device there being no electrically conducting connection between transmitter and receiver.

The transmitter of electromagnetic energy is located such that its temperature is considerably above the cryogenic temperature of the superconducting magnet coil. The transmitter can be switched on quickly, and by providing the receiver in the region of the superconducting switch at the cryogenic temperature level of the superconducting magnet coil, there is no electrically conducting connection between transmitter and receiver. The receiver may transmit the received energy directly or indirectly to a heating device for heating the superconducting switch or may activate an auxiliary energy source in the region of the superconducting switch, which in turn effects a heating of the superconducting switch, so that it loses superconductivity and causes a discharge process of the superconducting magnet coil via resistors and/or diodes which are located within the cryostat.

In this way, the superconducting switch can always be immediately activated from outside, and due to the contactless transmission without any electrical connection, and thereby also essentially without thermal connection, a permanent heat input into the helium tank is largely avoided.

In one embodiment of the invention the transmitter is an optical or infrared light source, in particular a laser, or is the end of a light guide originating from such a light source, respectively.

This has the advantage that the energy can be guided to the region of the superconducting switch by known optical means.

In a further embodiment of the invention the receiver comprises a surface which is absorbing in the frequency range of the energy emitted by the transmitter, and the electromagnetic radiation is directed or focused at the said surface. The receiver may be connected to the superconducting switch in a thermally conductive way.

This has the advantage that a large fraction of the radiation energy is directly used to heat the switch. In a preferred embodiment, the receiver surface facing the transmitter comprises a recess, into which the electromagnetic radiation emitted by the transmitter is focused, and which acts as a radiation trap.

In a further embodiment, the receiver is a photoelectric cell electrically connected to a heater resistor to heat the superconducting switch.

This has the advantage that, as in the prior art, heating of the switch is effected electrically, so that an existing switch configuration may be utilized.

In an improvement of the above-mentioned embodiments, the receiver itself or a light guide connected to it protrudes above the magnet coil to an extent such that the optical path which has to be bridged starting from the transmitter runs only in gas or inside the light guide, respectively, but not in the cryogenic liquid, even for the highest filling level of a cryogenic liquid surrounding the coil.

This has the advantage that less scattering losses occur.

In another embodiment, transmitter and receiver are electric coils, which are inductively coupled, but without physical contact, at least without electrically conductive contact. The transmitter coil is electrically connected to an ac generator via a switch and the receiver coil to a heater resistor to heat the superconducting switch.

This has the advantage that an electric heater can be used which may be already present.

Depending on the design, the coupling from the receiver coil to the heater may not be effected directly but via a transformer stage.

This has the advantage that higher heater currents can be achieved.

In an embodiment of the invention, the receiver is the coil of a resonant circuit oscillating with the frequency of the ac voltage delivered by the generator. The heater resistor of the superconducting switch is either part of this resonance circuit or it is switched into it, if a voltage level should be exceeded in the resonance circuit, by means of active or passive switching elements, for example by the irreversible switching through of a diode. This has the advantage that, if need be during a certain time interval, energy can be absorbed, resonantly or for a short time can be accumulated and stored, respectively, which then heats the switch either continuously or suddenly.

With the inductive transmission one generally has to ensure that additional ac fields originating during spectrometer operation do not couple into the receiver coil and produce undesired heat, or even trigger an unintended quench. This can be achieved by careful selection of a resonance frequency or by compensation coils which compensate interfering fields but not that of the transmitter coil.

Finally, in a further alternative embodiment of the invention, chemical energy is released by the receiver which heats the superconducting switch. Again, this may either be effected by direct absorption of the radiation (e.g. laser radiation) from the transmitter which heats a chemical substance in a first step, triggering an exothermic chemical reaction, which then yields sufficient energy to open the switch.

Alternatively, the "triggering" of the chemical reaction can be effected electrically, thereby requiring considerably less energy to be delivered by the transmitter compared to that required by the switch heater circuit.

This has the advantage that very low electromagnetic energies are sufficient since they only have to trigger the chemical reaction, which then runs on its own. The last-mentioned embodiment of the invention is intended only for emergency use, since the replacement of the chemical "charges" would involve considerable effort.

This idea may be extended to small electrical, magnetic long-term stores or the like, possibly even mechanical ones, which can be operated at cryogenic temperatures, with sufficient energy content to heat the superconducting switch and safely to trigger a discharge and which can be triggered from room temperature without leads.

A method to operate an apparatus as described above is also within the frame of the invention, wherein the superconducting switch is opened without physical contact, by a signal emitted from outside the cryostat in order to discharge the superconductively persistent magnet coil.

It is common to all embodiments of the invention that the quench of the superconducting coil is essentially triggered without physical contact, i.e. the energy of the trigger signal is transported from the transmitter at a relatively high temperature to the receiver at cryogenic temperature by the electromagnetic field and not by electric or thermal conduction.

A number of preferred embodiments of the invention will now be described with reference to the accompanying drawings, in which:

FIG. 5a shows a first embodiment of the receiver and the heating means for the superconducting switch of an apparatus according to the invention with inductive energy transmission;

FIG. 5b shows a second embodiment of the receiver and the heating means for the superconducting switch of an apparatus according to the invention with inductive energy transmission;

FIG. 6a shows a first embodiment of the receiver and the heating means for the superconducting switch of an apparatus according to the invention with triggering of an exothermic chemical reaction;

FIG. 6b shows a second embodiment of the receiver and the heating means for the superconducting switch of an apparatus according to the invention with triggering of an exothermic chemical reaction.

The accompanying drawings are by way of example only, and are not intended to be considered as exhaustive enumeration. The preferred features mentioned above and those to be further described below in accordance with the invention can be utilized individually or collectively in desired combination.

DESCRIPTION OF THE PREFERRED EMBODIMENTS

Figure 1:
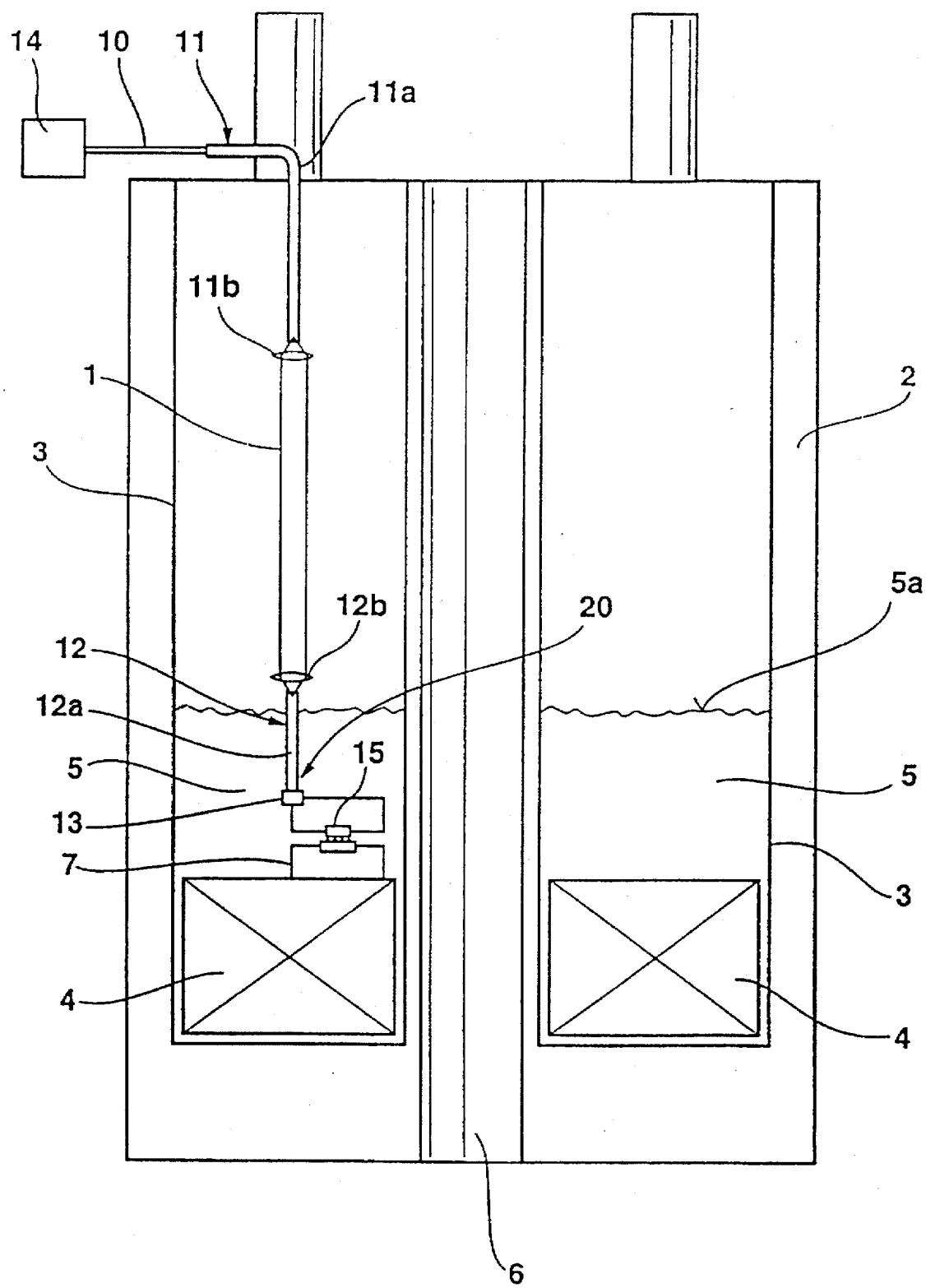
FIG. 1 shows a schematic configuration of a first embodiment of an apparatus according to the invention with optical energy transmission.

In detail, FIG. 1 shows a first embodiment of an apparatus 1 according to the invention, where the energy to start the discharge process of a persistent superconducting magnet coil 4 is transmitted optically. Inside the helium tank 3 of a schematically sketched cryostat 2 there is a superconducting magnet coil 4 immersed in a liquid helium bath 5 to produce a homogeneous magnetic field within a measuring volume inside a room temperature bore 6 of the cryostat. Cryostat 2 can be part of an apparatus to measure nuclear magnetic resonance of a sample. Per se known details of such a cryostat with low consumption of cryogenic liquids belong to the general knowledge of an expert in the field and are omitted for clarity reasons.

During operation, all current or heat carrying leads from room temperature to the superconducting magnet coil 4 are removed and the coil is short-cut in a persistent mode by a heat-closed superconducting switch 7 so that a superconducting persistent current is flowing generating the homogeneous magnetic field generally in the range around 10 Tesla. During the charging process, the superconducting switch 7 was opened by electric heating via external leads which had been inserted into the helium tank 3 of cryostat 2 together with those for the main magnet current by means of so-called current leads. During operation, these current leads are removed again after closing switch 7 by switching off its heating.

Outside cryostat 2 there is an optical radiation source e.g. a laser 14, whose emitted radiation is guided into the helium tank 3 of cryostat 2 by optical means 11, which for example comprise a glass fiber bundle 11a and a first lens 11b. Combined optical radiation source 14 and optical means form a transmitter 10 to emit electromagnetic energy, which in the present embodiment is light energy.

Inside cryostat 2, the emitted radiation is focused onto a photoelectric cell 13 located in the region of the superconducting switch by means of further optical means 12 comprising a further lens 12b and a further glass fiber bundle. The photoelectric cell at least partially transforms the received radiation into electric current, which is guided to a respective heating means 15 in order to heat the superconducting switch 7. Combination of the photoelectric cell 13 and the further optical means 12 form a receiver 20 to receive the electromagnetic energy emitted by transmitter 10.

One end of glass fiber bundle 12a is always located above the helium level 5a of the liquid helium 5 inside the helium tank, i.e. the radiation path in side cryostat 2 is always either in the fiber bundles 11a and 12a or within further components of the optical means 11, 12 or in helium gas, but not in liquid. In this way, transmitter 10 has no electrically conductive, and therefore also no thermally conductive contact to receiver 20.

Figure 2:
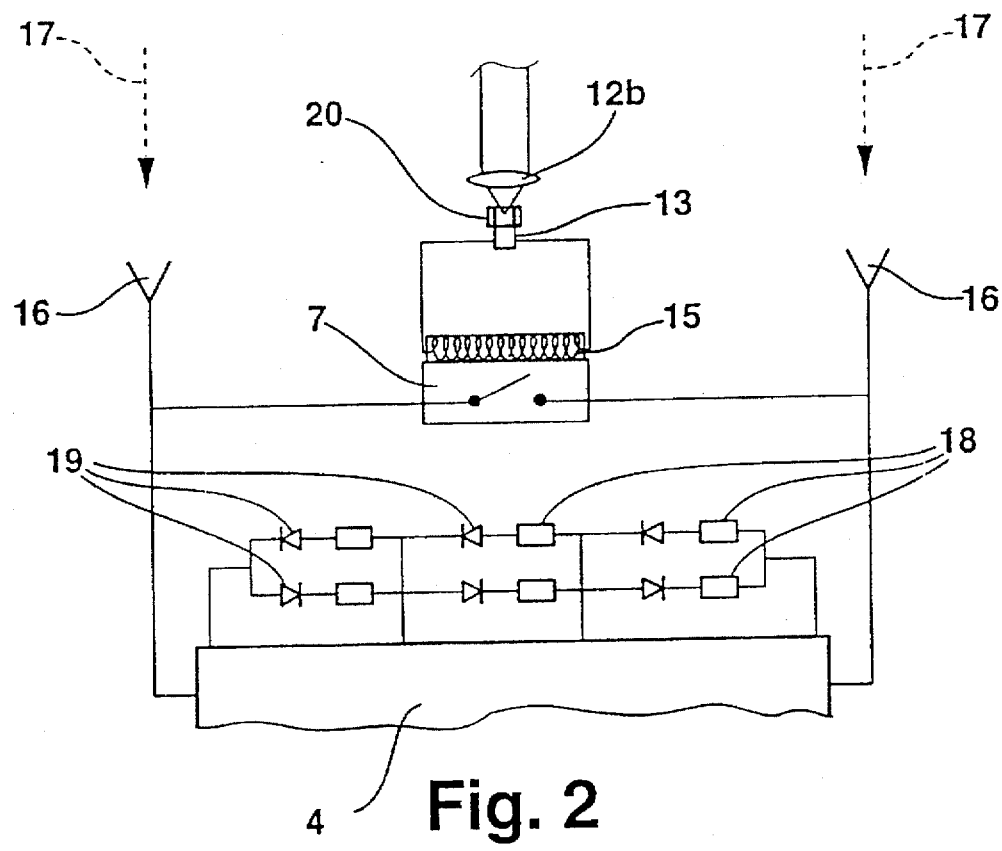
FIG. 2b shows a schematic circuit diagram of an embodiment of an apparatus according to the invention.

FIG. 2 shows a schematic circuit diagram of an embodiment of the apparatus 1 according to the invention. In the superconducting persistent mode of magnet coil 4, the superconducting switch is closed and the current leads 17, which are used to charge coil 4, are pulled out of the current sockets 16 as well as also completely out of the cryostat 2. If in the persistent mode, magnet coil 4 shall be discharged deliberately and without contact, electromagnetic energy, light energy in the embodiment shown, is coupled via the further lens 12b into receiver 20, and in the embodiment shown received by a photoelectric cell 13, which converts the light energy into electric current and guides it to the heating means 15. In this way, the superconducting switch is heated and becomes normal conducting whereafter the superconducting magnet coil 4 is discharged in a defined way via resistors 18 and diodes 19.

Figure 3A:
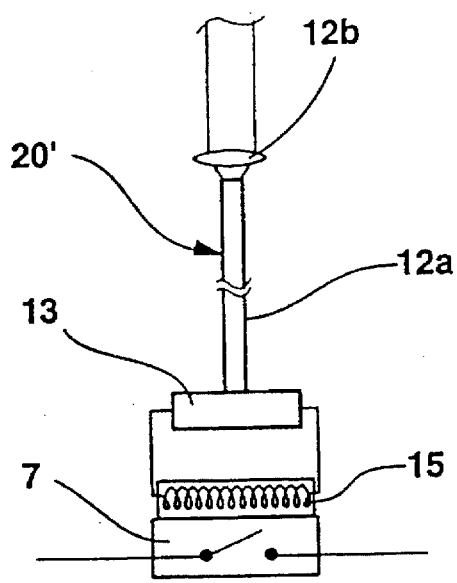
FIG. 3 shows a first embodiment of the receiver and the heating means for the superconducting switch of an apparatus according to the invention with optical energy transmission.
FIG. 3b shows a second embodiment of the receiver and the heating means for the superconducting switch of an apparatus according to the invention with optical energy transmission.

FIG. 3a shows an embodiment of a receiver 20' which collects optical energy via a further lens 12b and a further fiber glass bundle 12a and transfers it to a photoelectric cell 13 which converts the received light energy into electric current and transmits it to a heating means 15 for heating the superconducting switch 7.

Figure 3B:
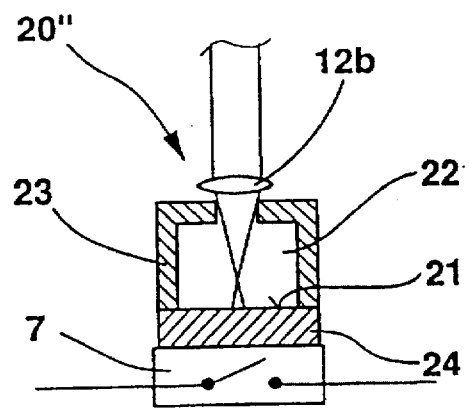

The embodiment of receiver 20" shown in FIG. 3b is somewhat more compact and simple, where the light energy received via further lens 12b is directly focused onto a surface 21 in a recess 22 of a radiation trap 23 which surface 21 faces the transmitter which is not shown. Surface 21 is, for example by an appropriate coating, adapted to optimally absorb electromagnetic radiation in the frequency band of the energy emitted by transmitter 10. It is part of a heat-conducting plate 24 which is, at the side facing away from surface 21, in thermal contact to the superconducting switch which is heated by the electromagnetic energy received.

Figure 4:
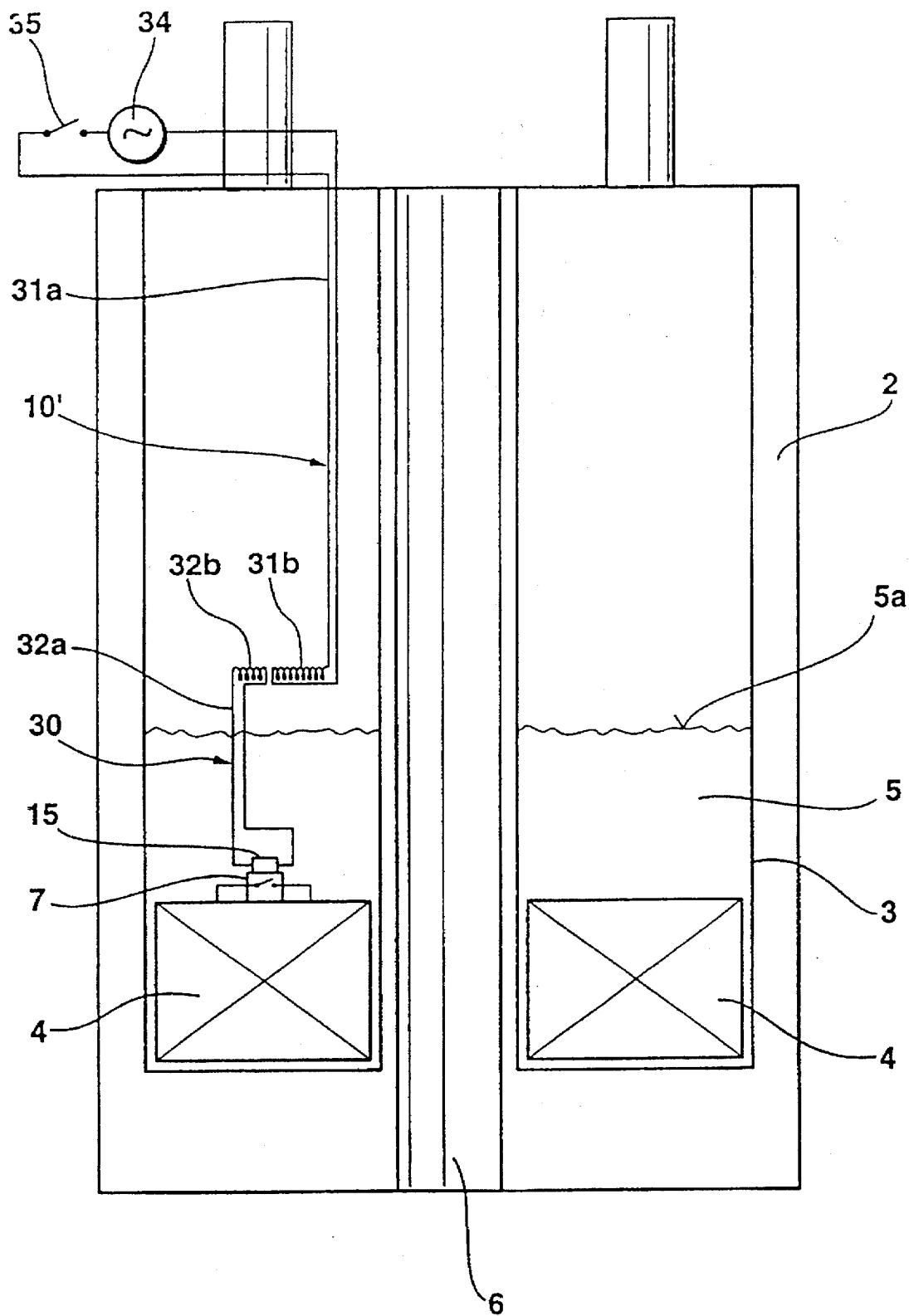
FIG. 4 shows a schematic configuration of a further embodiment of an apparatus according to the invention with inductive energy transmission.

In the embodiment of the discharge unit according to the invention shown in FIG. 4, a transmitter 10' for electromagnetic energy comprises an ac voltage source 34 supplying, if needed, via very thin wires 31a a small current with a comparably high electric voltage to an electric coil 31b located inside cryostat 2 above helium level 5a. On the coil axis, opposite first coil 31b, a second coil 32b is located comprising considerably less windings than first coil 31b. Thus, coils 31a and 31b form a transformer stage. The ac magnetic field generated by first coil 31b induces in the further coil 32b a higher secondary current according to the transformation ratio of both coils, which, by means of accordingly stronger electric leads 32a, is transferred to a heating means 15 to electrically heat superconducting switch 7. Accordingly, further coil 32b and further leads 32a form a receiver 30 for the electromagnetic energy emitted by transmitter 10'. A switch 35, represented schematically in the figure, serves to switch on and off transmitter 10'.

Further coil 32b can also be part of a receiver resonance circuit oscillating with the frequency of the ac voltage supplied by ac voltage generator 34, wherein heating means 15 for the superconducting switch 7 is a heater resistor and is either part of the resonance circuit or is switched into this in case a voltage level is exceeded in the resonance circuit by means of active or passive switch elements (not shown in the drawing), in particular by the irreversible switching of a diode.

In FIG. 5a, a further embodiment of a device to heat the superconducting switch by inductive energy transfer is represented schematically. In this case, too, a transformer consisting of first coil 31b and further coil 32b face each other coaxially and without contact.

In contrast, FIG. 5b shows a configuration where both coils 31b and 32b are nested, where possibly even a light mechanical contact of the coil wires could be tolerated, as long as these are electrically insulated from each other.

In a further alternative for heating the superconducting switch 7, a storage for chemical, electromagnetic or mechanical energy is located inside the cryostat. By means of a signal from the receiver of the device according to the invention, the energy stored is retrieved partly or completely and used for heating. In this context, a mechanical energy storage could for example be a spring element under tension (not shown in the drawing) which suddenly releases it tension because of heating by the electromagnetic energy received, thereby generating friction heat which heats the superconducting switch 7.

FIG. 6a shows an embodiment of the device according to the invention, where one or more chemical substances are filled into a container 41 in thermal contact with superconducting switch 7, which substances start an exothermic chemical reaction in case of a small energy input, wherein the released chemical energy is sufficient for heating the superconducting switch 7 and to transfer it into the normal-conducting open mode. In the example shown in FIG. 6a, the necessary trigger energy in the form of light radiation is, via a lens 12b, coupled into a radiation trap 23 which together with lens 12b represents a receiver 40 for electromagnetic energy.

However, as shown in FIG. 6b instead of in an optical way, the required energy can also be coupled in the form of an ac current of low current strength and high voltage from an ac generator 34 via thin leads 31a and a coil 31b to a correspondingly adapted receiver 40' comprising a receiver coil 32b to transform the electric current signal received to higher current values and to guide it via leads 32a to a heater resistor 42. The heater resistor can locally heat the chemical substance inside the container 41 within a relatively small volume and trigger at this location the exothermic chemical reaction which effects its transfer into the normal-conducting state.

We claim:

1. A device for discharging a superconducting magnet coil within a cryostat for maintaining the coil at or below a cryogenic temperature, the magnet having a superconducting switch for short-circuiting the magnet during operation, the device comprising:

an energy dissipation device located so as, during operation, to be at or below the cryogenic temperature;
    a transmitter of electromagnetic energy located so as, during operation, to be above the cryogenic temperature;
    switching means for switching on the transmitter from outside the cryostat; and
    a receiver for the electromagnetic energy, the receiver being electrically unconnected to the transmitter and being positioned in the vicinity of the superconducting switch at a location which, during operation, is at or below the cryogenic temperature, wherein the receiver comprises a surface which absorbs in the frequency range of the electromagnetic energy emitted by the transmitter, the surface facing the transmitter and having a recess into which the electromagnetic radiation is focused such that the recess acts as a radiation trap, and wherein the receiver is such that, upon reception of electromagnetic energy from the transmitter, the receiver effects a heating of the superconducting switch to causing it to lose its superconductivity, thereby causing a discharge process of the superconducting magnet coil via the energy dissipation device.

2. A device according to claim 1, wherein the transmitter incorporates a laser.

3. A device according to claim 1, wherein the cryostat is adapted to be filled with a cryogenic fluid and wherein the transmitter further comprises a first lens to direct the electromagnetic radiation leaving the transmitter to the receiver and wherein the receiver further comprises a second lens, the second lens being located above the cryogenic fluid level.

4. A device for the safe discharge of a superconducting magnet coil with a cryostat for maintaining the coil at or below a cryogenic temperature, the magnet having a superconducting switch for superconductively short-circuiting the magnet during operation, the device comprising:

an energy dissipation device located so as, during operation, to be at or below the cryogenic temperature;
    an optical or infrared transmitter located so as, during operation, to be above the cryogenic temperature;
    switching means for switching on the transmitter from outside the cryostat; and
    a receiver for the electromagnetic energy which comprises a heater resistor positioned adjacent the superconducting switch and a photoelectric cell electrically connected to the heater resistor to heat the superconducting switch, the receiver being electrically unconnected to the transmitter and being positioned in the vicinity of the superconducting switch at a location which, during operation, is at or below the cryogenic temperature, wherein the receiver comprises a surface which absorbs in the frequency range of the electromagnetic energy emitted by the transmitter and, upon reception of electromagnetic energy from the transmitter, the receiver effects a heating of the superconducting switch to cause it to lose its superconductivity, and thereby cause a discharge process of the superconducting magnet coil via the energy dissipation device.

5. A device according to claim 4, wherein the transmitter comprises a laser.

6. A device for the safe discharge of a superconducting magnet coil within a cryostat for maintaining the coil at or below a cryogenic temperature, the magnet having a superconducting switch for superconductively short-circuiting the magnet during operation, the device comprising;

an energy dissipation device located so as, during operation, to be at or below the cryogenic temperature;
    a transmitter of electromagnetic energy located so as, during operation, to be above the cryogenic temperature, the transmitter comprising at least one electric transmitter coil and an ac voltage generator generating an electrical signal at a resonant frequency;
    switching means for switching on the transmitter from outside the cryostat;
    a receiver which is electrically unconnected to the transmitter, and which is positioned in the vicinity of the superconducting switch at a location which, during operation, is at or below the cryogenic temperature, the receiver receiving the electromagnetic energy and comprising a coil of a resonant circuit which is resonant at said resonant frequency and inductively coupled with the transmitter coil, the receiver comprising at least one heater resistor which is adjacent the superconducting switch and connected to the resonant coil, and which forms part of said resonant circuit, the receiver further comprising a transformer stage to couple the energy from the receiver coil to the heater resistor such that, upon reception of electromagnetic energy from the transmitter, the receiver effects a heating of the superconducting switch to cause it to lose its superconductivity, and thereby cause a discharge process of the superconducting magnet coil via the energy dissipation device.

7. A device according to claim 6, further comprising a transformer stage to couple the energy from the receiver coil to the heat resistor.

8. A device according to claim 6, wherein the receiver comprises a coil of a resonant circuit having a resonance frequency corresponding to that of the ac voltage produced by the ac generator, and wherein the heater resistor forms a part of the resonant circuit.

9. A device for the safe discharge of a superconducting magnet coil within a cryostat for maintaining the coil at or below a cryogenic temperature, the magnet having a superconducting switch for superconductively short-circuiting the magnet during operation, wherein the device comprises:

an energy dissipation device located so as, during operation, to be at or below the cryogenic temperature;

a transmitter of electromagnetic energy located so as, during operation, to be above the cryogenic temperature;

switching means for switching on the transmitter from outside the cryostat;

a receiver for the electromagnetic energy, the receiver being electrically unconnected to the transmitter and being positioned in the vicinity of the superconducting switch at a location which, during operation, is at or below the cryogenic temperature;

storage means for chemical or mechanical energy, positioned inside the cryostat, and means associated with the receiver for causing release of the stored energy completely or partially thereby to heat the superconducting switch; and wherein the receiver is such that, upon reception of electromagnetic energy from the transmitter, the receiver effects a heating of the superconducting switch to cause it to lose its superconductivity, and thereby cause a discharge process of the superconducting magnet coil via the energy dissipation device.

10. A device according to claim 9, wherein the receiver is such as to transfer to the storage means electromagnetic radiation energy received from the transmitter.

11. A device according to claim 9, wherein the storage means contains at least one chemical substance which, when heated by means of electromagnetic radiation energy received, starts an exothermic chemical reaction, wherein the energy released in the said exothermic chemical reaction is sufficient to heat the superconducting switch.

12. A device according to claim 11, wherein the chemical substance absorbs light or infrared radiation, and wherein the chemical substance itself constitutes the receiver.

13. A device according to claim 11, wherein the receiver receives electrical energy from the transmitter and wherein the said electrical energy received is transferred to the chemical substance to trigger the exothermic reaction.

* * * * *